United States Patent [19]

Holler et al.

[11] Patent Number: 5,268,320

[45] Date of Patent: Dec. 7, 1993

[54] METHOD OF INCREASING THE ACCURACY OF AN ANALOG CIRCUIT EMPLOYING FLOATING GATE MEMORY DEVICES

[75] Inventors: Mark A. Holler, Palo Alto; Simon M. Tam, Redwood City, both of Calif.

[73] Assignee: Intel Corporation, Santa Clara, Calif.

[21] Appl. No.: 865,451

[22] Filed: Apr. 9, 1992

Related U.S. Application Data

[62] Division of Ser. No. 634,033, Dec. 26, 1990, Pat. No. 5,146,602.

[51] Int. Cl.$^5$ .................. H01L 21/265; H01L 21/76
[52] U.S. Cl. .......................................... 437/43; 395/23
[58] Field of Search .................. 395/23, 24; 365/182; 437/244, 31, 43

[56] References Cited

U.S. PATENT DOCUMENTS

| | | | |
|---|---|---|---|
| 4,490,900 | 1/1985 | Chiu | 437/244 |
| 5,079,177 | 1/1992 | Lage et al. | 437/31 |
| 5,104,819 | 4/1992 | Freiberger et al. | 437/43 |
| 5,138,573 | 8/1992 | Jeuch | 365/182 |

OTHER PUBLICATIONS

Goser et al., "VLSI Tech. for Artificial Neural Networks", IEEE Micro 1989.

Primary Examiner—Allen R. MacDonald
Assistant Examiner—George Davis
Attorney, Agent, or Firm—Blakely, Sokoloff, Taylor & Zafman

[57] ABSTRACT

A method for increasing the accuracy of an analog neural network which computers a sum-of-products between an input vector and a stored weight pattern is described. In one embodiment of the present invention, the method comprises initially training the network by programming the synapses with a certain weight pattern. The training may be carried out using any standard learning algorithm. Preferably, a back-propagation learning algorithm is employed.

Next, the network is baked at an elevated temperature to effectuate a change in the weight pattern previously programmed during initial training. This change results from a charge redistribution which occurs within each of the synapses of the network. After baking, the network is then retrained to compensate for the change resulting from the charge redistribution. The baking and retraining steps may be successively repeated to increase the accuracy of the neural network to any desired level.

3 Claims, 4 Drawing Sheets

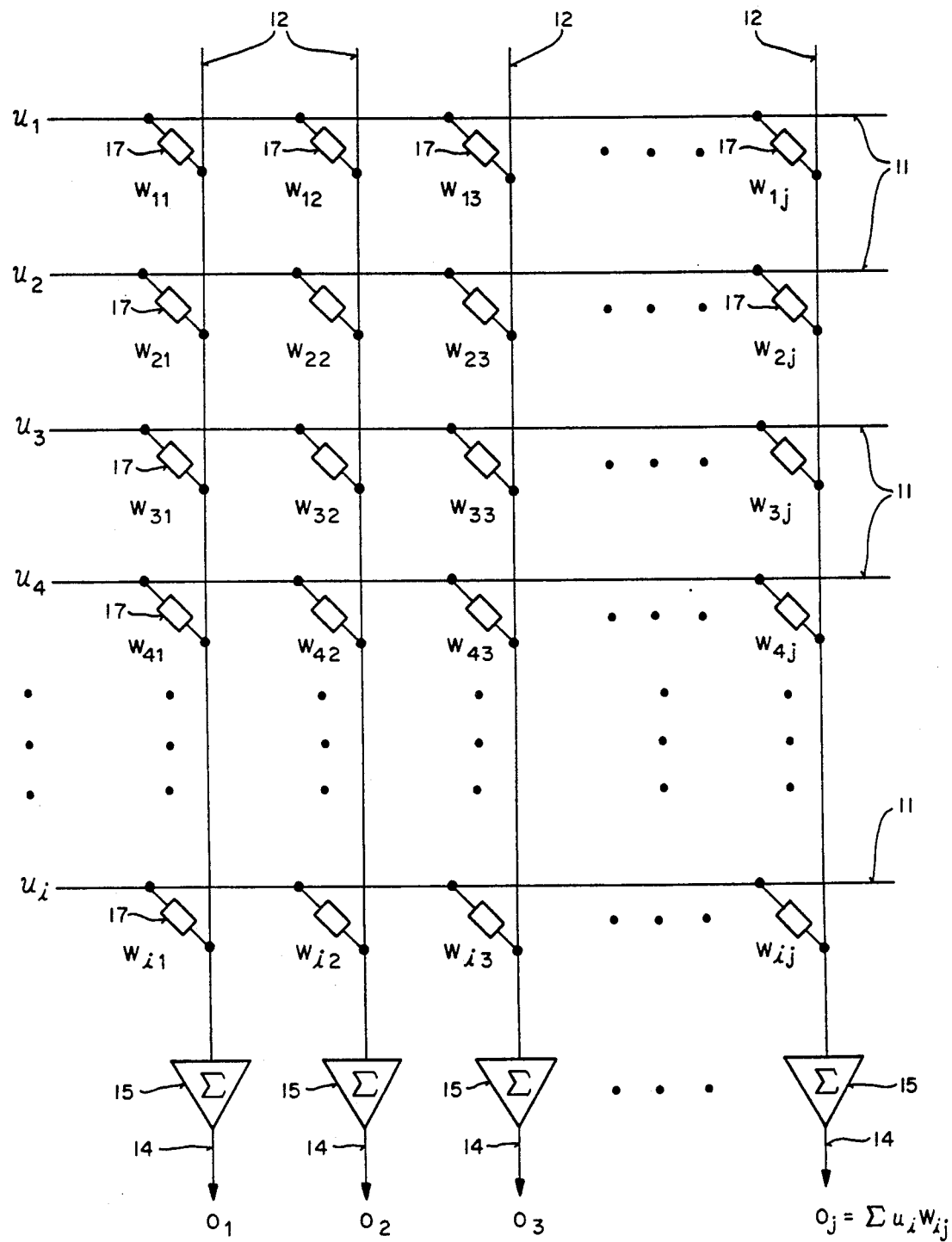
FIG _ 1 (PRIOR ART)

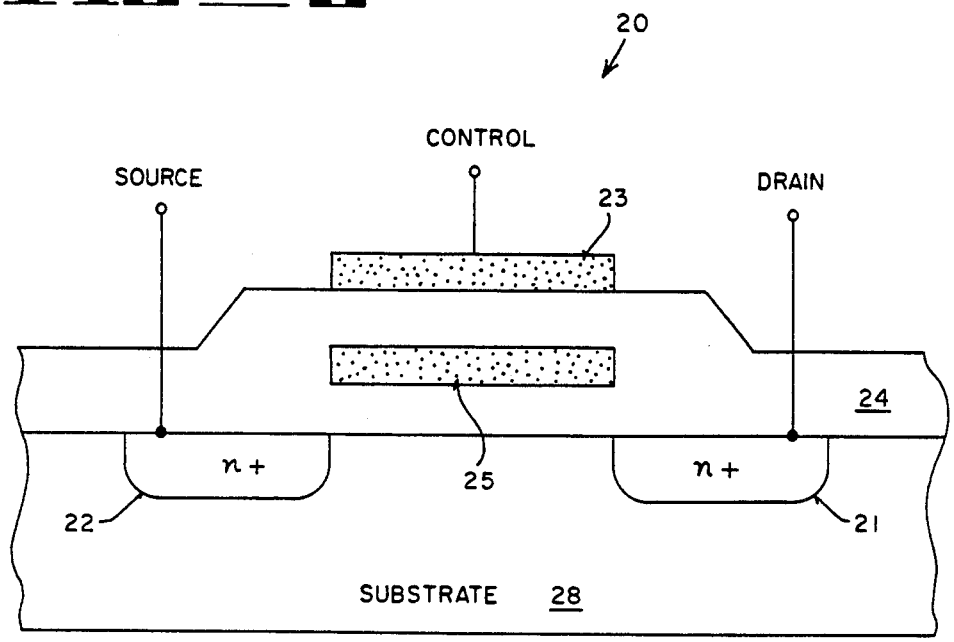
FIG_2
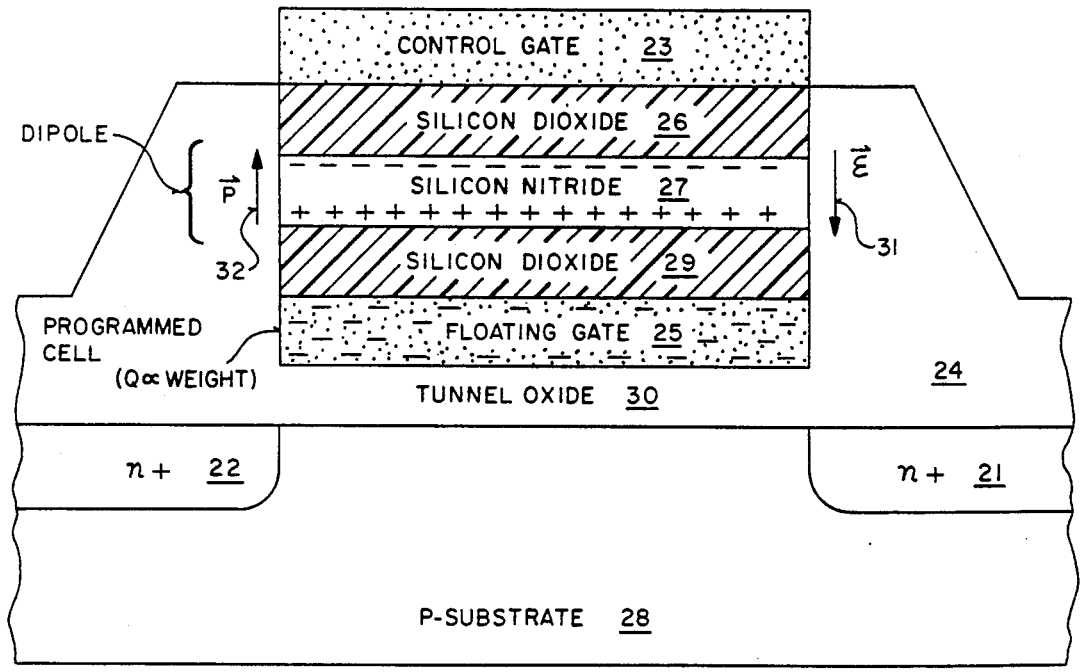
FIG_3

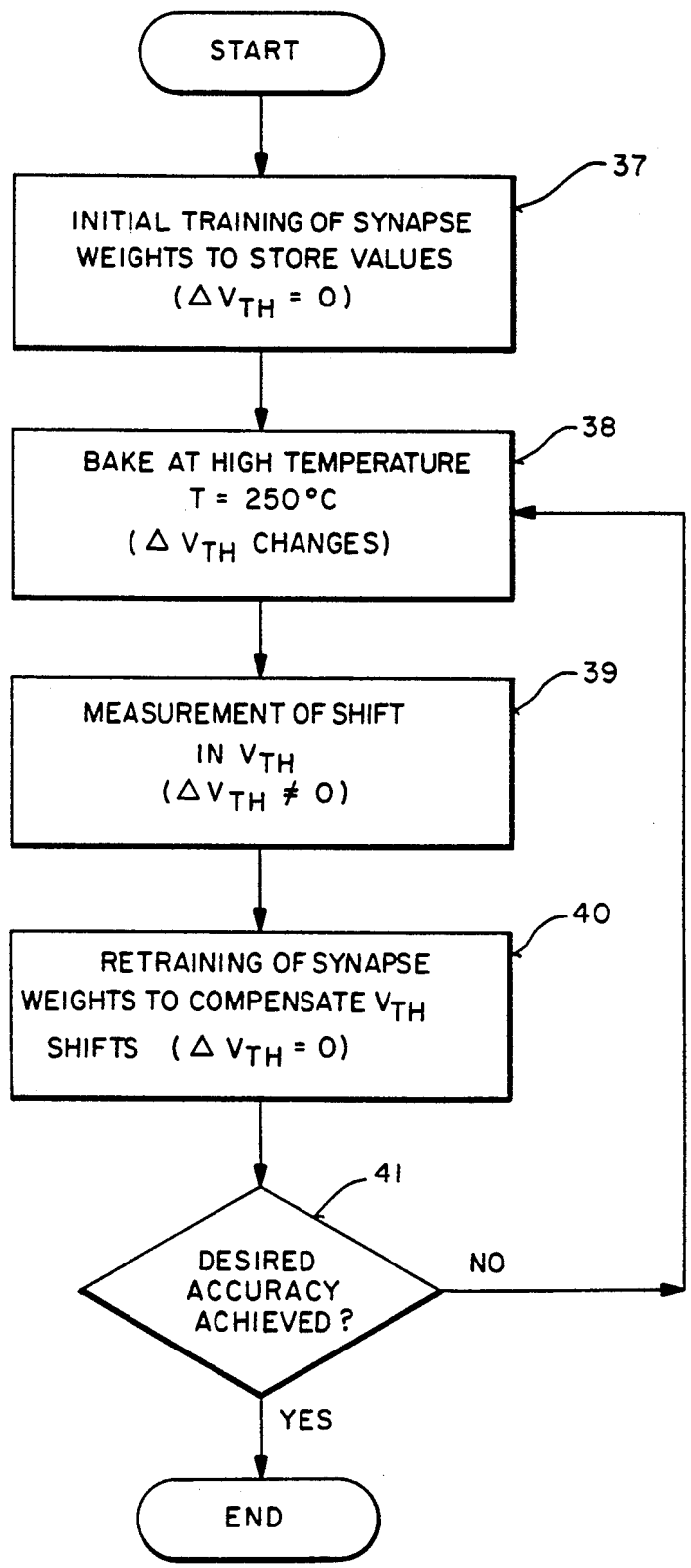

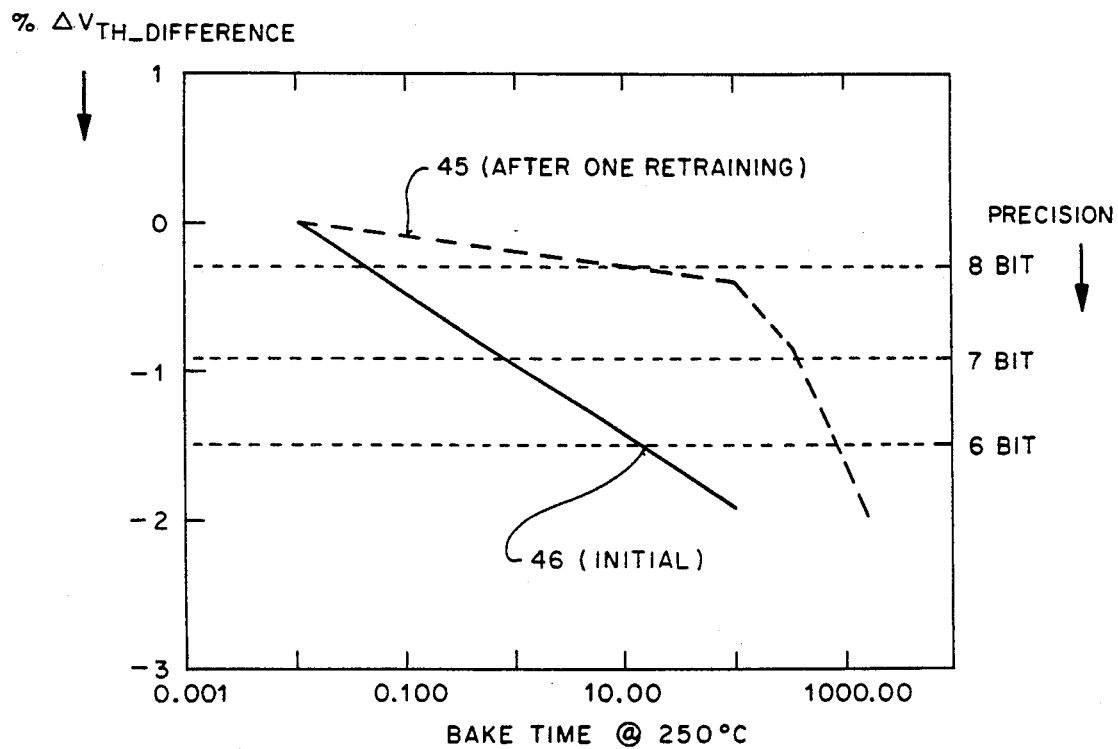

METHOD OF INCREASING THE ACCURACY OF AN ANALOG CIRCUIT EMPLOYING FLOATING GATE MEMORY DEVICES

This is a divisional of application Ser. No. 07/634,033, filed Dec. 26, 1990, U.S. Pat. No. 5,146,602.

RELATED APPLICATIONS

The present invention is related to co-pending application entitled, "Adaptively Setting Analog Weights in A Neural Network And The Like", Ser. No. 07/634,033, filed Dec. 26, 1990, U.S. Pat. No. 5,146,602 which is assigned to the assignee of the present invention.

FIELD OF THE INVENTION

The invention pertains generally to the field of floating gate memory devices; more specifically, to artificial neural networks which employ floating gate devices for emulating high-order functions performed in the cortex of the human brain.

BACKGROUND OF THE INVENTION

Neural networks are a class of electronic circuits which emulate higher-order brain functions such as memory, learning and/or perception/recognition. Associative networks are one category of neural devices which sense an input event and output a pattern of signals identifying that event.

Associative networks generally take the form of a matrix comprising a set of horizontal lines which cross and contact a set of vertical lines. The horizontal lines simulate the function of axons in the cortex of the brain and are used as inputs. The vertical lines simulate the function of dendrites extending from neurons. Each vertical line terminates at a voltage summing device which acts to simulate the function of the neuron cell body. Examples of such associative networks are found in co-pending applications entitled; "Semiconductor Cell For Neural Network Employing A Four-Quadrant Multiplier", Ser. No. 283,553, filed Dec. 9, 1988; "EXCLUSIVE-OR Cell For Neural Network And The Like", Ser. No. 309,247, filed Feb. 10, 1989; and "Neural Network Employing Leveled Summing Scheme With Blocked Array", Ser. No. 357,411, filed May 26, 1989, all of which are assigned to the assignee of the present application.

Within an associative network, neural synapses are simulated by circuit cells which provide electrical connection between the horizontal and vertical lines of the network. Individual synapses provide a weighted electrical connection between an input and a voltage summing elements, i.e., a neuron. Basically, the synapse cell outputs the product of an input signal and a weight value stored within the synapse. these synapse cells may either be analog or digital in nature. Analog circuitry is often preferred over digital circuitry for neural networks because of its superior density.

For an analog implementation, the weighted sum of input signals is usually computed by summing analog currents or charge packets. Examples of circuit devices useful as synapse cells in neural networks are described in the co-pending applications entitled, "Adaptive Synapse Cell Providing Both Excitatory And Inhibitory Connections In An Associative Network", Ser. No. 379,933, filed Jul. 13, 1989; and "Improved Synapse Cell Employing Dual Gate Transistor Structure", Ser. No. 419,685, filed Oct. 11, 1989, which applications are also assigned to the assignee of the present invention.

In these exemplary devices, the synapse cells employ floating gate transistors which store charge representing a weighted value of the synapse connection (i.e., the connection strength). Floating gate transistors take a variety of forms in the prior art, some being both electrically erasable and electrically programmable and other requiring, for example, ultraviolet light for erasing. Most often, the floating gate of these devices is made up of a polycrystalline silicon (i.e., polysilicon) member which is completely surrounded by an insulative layer. These non-volatile storage devices are frequently referred to in the prior art as EPROMs, EEPROMs or flash EPROMs. The currently preferred embodiment of the present invention employs standard EEPROMs, however, ordinary EPROMs or flash EPROM devices may also be utilized with similar results.

One of the major limitations associated with analog neural networks that employ floating gate devices is the inability of the synapse cells in the neural network to maintain high accuracy for an extended period of time. Accuracy is defined as the absolute value, measured in either voltage or charge, to which the synapse weight is set. As time passes, the programmed weight values stored in the synapses cells tend to dwindle due to charge redistribution which occurs in the dielectric material surrounding the floating gate member. These changes can result in erroneous products of the input signals and weights, thereby lowering the overall accuracy of the neural network.

To be more specific, the dielectric (e.g., silicon dioxide) which covers and insulates the polysilicon floating gate from the control gate of the EEPROM, relaxes with time. This relaxation redistributes the charge already present within the dielectric material. Effectively, this charge redistribution causes a shift in the threshold voltage, $V_{th}$, of the floating gate transistor. The threshold voltage $V_{th}$ is one measure of the weight stored within a synapse cell. Hence, any shift in charge distribution translates into a corresponding $V_{th}$ shift.

Such non-programmed and unintentional decreases in $V_{th}$ lead to inaccuracies in the sum-of-products (SOP) computed by summing the products of stored weights and input values at the output of the network. Ideally, each synapse cell should be able to store its set weight value throughout the life of the neural network. However, because of the dielectric relaxation phenomenon, the stored weight programmed onto the floating gate diminishes over time. Moreover, since the charge redistribution occurs gradually, the cell's weight value varies continuously over time with a decreasing rate. Thus, the overall, long-term accuracy of the neural network is seriously affected by this charge redistribution phenomenon. It is appreciated by practitioners in the art that without high accuracy, the reliability of a neural network is significantly hampered or its information capacity is seriously limited.

The need for high accuracy exists not only in neural networks which rely upon floating gate technology, but also in those networks which employ volatile memories as well. In fact, volatile memory neural networks face even greater difficulties in achieving high accuracy. By way of example, in a neural network utilizing dynamic memory cells, dynamic storage of the weight must be performed—typically using a capacitive device such as a dynamic random-access memory (DRAM) cell. The drawback with using DRAMs is that charge is constantly leaking from the memory cell. This discharge mandates that the DRAM be continuously refreshed. Consequently, a separate memory chip containing digitally stored values must be provided. If the weights are stored externally, the increase in chip area resulting from the additional DRAMs will dramatically increase the manufacturing cost of the entire neural network system.

Alternatively, an on-chip refresh circuit may be implemented that captures the volatile analog levels of the memory and compares them to a finite set of quantized levels that are equally spaced. Refresh is performed more often than the time it takes the fastest leaking cell to decay by the voltage difference between adjacent quantized levels. At the time of refresh the analog level is reset to the next higher quantized level.

However, this approach also suffers from serious drawbacks. Foremost among these is the fact that the accuracy of the stored analog weights is always limited by the difference between the quantized levels. The quantized levels cannot be spaced too closely as this will require more frequent refresh and may lead to errors in comparing the analog levels to the quantized levels. Faster refresh is required when the quantized levels are spaced more closely because it takes the analog level less time to decay past the next lower quantized level. If an analog level decays past the next lower quantized level before it is refreshed, it will be refreshed to a value equal to that next lower and its original value will be lost. In the past, this has been a fundamental limitation for these circuits.

Therefore, what is needed is a new method for increasing the accuracy of analog synaptic connections. A method which compensates for the redistribution of charge which naturally and predictably occurs in a floating gate memory device is one such solution. As will be seen, the present invention greatly increases the accuracy of the weights by performing bake and retraining cycles which compensate for any charge redistribution that occurs.

SUMMARY OF THE INVENTION

A method for increasing the accuracy of an analog neural network which employs floating gate devices to compute a sum-of-products between an input vector and a stored weight vector is described. In one embodiment of the present invention, the method comprises initially training the network by programming the synapses with a certain weight pattern. The training may be carried out using any standard learning algorithm. Preferably, the well-known back-propagation learning algorithm is employed.

Next, the network is baked at an elevated temperature to effectuate a change in the weight pattern previously programmed during initial training. This change results from a charge redistribution which occurs within each of the synapses of the network. After baking, the network is then retrained to compensate for the change resulting from the charge redistribution. The baking and retraining steps may be successively repeated to increase the accuracy of the neural network to any desired level.

More generally, the method of the present invention is also useful for increasing the accuracy of any circuit which employs floating gate devices that are subject to charge redistribution phenomena.

BRIEF DESCRIPTION OF THE DRAWINGS

The novel features believed characteristic of the invention are set forth in the appended claims. The invention itself however, as well as other features and advantages thereof, will be best understood by reference to the description which follows, read in conjunction with the accompanying drawings, wherein:

FIG. 1 illustrates a prior art neural network.

FIGS. 2 and 3 are cross-sectional views of the floating gate memory device employed in the synapse cells of the neural network.

FIG. 4 is a flow chart of the present invention in which each step of the procedure is described.

FIG. 5 is a graph showing, by way of example, the differences in the rates of change between a neural network which underwent only the initial training followed by a bake, and a neural network which underwent the initial training plus a retraining procedure following a high temperature bake.

DESCRIPTION OF THE PREFERRED EMBODIMENT(S)

A method of increasing the accuracy of an analog neural network and the like is illustrated. In the following description, numerous specific details are set forth, such as voltages, structures, cell-types, etc., in order to provide a thorough understanding of the invention. It will be obvious, however, to one skilled in the art that these specific details need not be used to practice the present invention. In other instances, well-known structures and methods have not been set forth in detail in order to avoid unnecessarily obscuring the present invention.

Referring to FIG. 1, a schematic of a prior art neural network is shown. Input patterns (e.g., stimuli) to the network are applied collectively along lines 11 in the form of input voltage signals $U_i$. Depending on the pattern of inputs supplied, the network of FIG. 1 cycles through a series of weight changes until the entire network converges to a certain solution (i.e., a certain pattern).

The artificial neural network of FIG. 1 also includes a plurality of synapse cells 17. Each of the synapse cells 17 provide a weighted connection between associated input lines 11 and output summing lines 12. The value of the stored weights is denoted $W_{ij}$ in FIG. 1. The output summing lines 12 are shown being coupled to the inputs of a set of neural summing devices 15, each of which ordinarily comprises an operational amplifier. The output of individual neurons 15 appears on line 14 as a sum-of-products of the input and stored weight patterns (e.g., $O_j = \Sigma U_i W_{ij}$).

Taken separately, each of the synapse cells 17 function as a sort of analog multiplier; multiplying the input voltage present on line 11 with a stored weight present in the synapse cell, providing the result on output summing line 12 in the form of an output current. Neural summing devices 15 then sum the individual current contributions provided by all the inputs as multiplied by the stored weights in the associated cells 17.

The synapse cells utilized in the neural network of the present invention comprise non-volatile floating gate memory devices. Such floating gate devices, including EPROMs, EEPROMs and flash EPROMs, are described extensively in the prior art. In the preferred embodiment of the present invention, ordinary EEPROM memory cells are utilized to store the weight values in the synapse cells. In the neural network embodiment, an analog weight value is stored on the floating gate of each cell in the form of a electrical charge (i.e., "Q").

Referring now to FIG. 2, a cross-sectional view of an ordinary EEPROM cell 20 shows a floating gate 25 completely surrounded by an insulative layer 24. Insulative layer 24 comprises a tunnel oxide region 30 and an interpoly dielectric layer 18. Typically, floating gate 25 is formed from a first polysilicon layer, and insulator 24 largely comprises silicon dioxide ($S_iO_2$). Disposed above, and insulated from floating gate 25 is a second polysilicon gate member 23. Gate 23 serves as the control gate for memory cell 20. EEPROM 20 further comprises spaced-apart N+ source and drain regions 22 and 21, respectively, formed in p-type substrate 28. These regions are normally formed by one or more ion implantations of an N+ dopant (e.g., arsenic, phosphorus, etc.) into substrate 28.

By appropriate biasing of the control gate 23 and the N+ regions, the memory cell is programmed. Programming operations are well-understood in the art and involve transfer of electrons from the substrate to the floating gate through dielectric 24. For the most part, this electronic charge persists on floating gate 25 until cell 20 is erased. That is, the electrons remain on floating gate 25 until different biasing conditions cause the electrons to Fowler-Nordheim tunnel from the floating gate 25 back into the substrate regions of memory cell 20.

As discussed above, control gate 23 and floating gate 25 are separated by insulative layer 24. The portion of insulator 24 which lies directly between gates 23 & 25 is frequently referred to as the interpoly dielectric. Very often, this interpoly dielectric comprises a stack or sandwich of various layers. Such a sequence is shown in the EEPROM cell of FIG. 3, wherein the interpoly dielectric comprises (from top to bottom) silicon dioxide layer 26, silicon nitride layer 27 and silicon dioxide layer 29. This sequence of insulative layers is commonly known as an oxide-nitride-oxide (ONO) stack. Below the ONO stack, floating gate 25 is insulated from p-type substrate 28 by tunnel oxide region 30, which typically comprises a thermally grown layer of silicon dioxide.

Prior to programming, interpoly dielectric 24 is electrically neutral with little or no charge residing on floating gate 25. After floating gate 25 has been programmed by electron transfer from the substrate to floating gate 25, an electric field is effectively generated across the entire ONO dielectric stack. The presence of this electric field causes a dipole to be formed within silicon nitride layer 27 slowly over time. The electric field is depicted in FIG. 3 by arrow 31, while the polarization field (equal and opposite in direction to the electric field) is represented by arrow 32.

Over the lifetime of the device, the interpoly dielectric stack gradually relaxes, with the relaxation manifesting itself in the form of a redistribution of charge in nitride layer 27. What happens is that charge is redistributed until the electric field across the silicon nitride layer drops to zero. At this point, the interpoly dielectric is once again electrically neutral.

Obviously, charge redistribution is undesirable since any change in the electrical state of the floating gate results in a $V_{th}$ shift in the EEPROM synapse cell. This is especially true if the floating gate is being used to store an analog value. Thus, in a neural network, charge redistribution acts to gradually diminish the programmed strength of the synaptic connection over time, thereby adversely affecting network accuracy. This effect is counteracted according to the present invention by first baking and then retraining the network to effectively cancel out any Vth shift arising from the charge redistribution phenomena. The method of the present invention is described in more detail below.

Analog weight setting is performed utilizing an adaptive learning algorithm. This algorithm sets the stored weight values by successively altering the amount of charge on the floating gate while repeatedly monitoring the threshold voltage of the transistor. The measured $V_{th}$ is compared to a desired $V_{th}$ which corresponds to the desired weight value. Electrons are removed and/or added to the floating gate until the measured $V_{th}$ matches the target $V_{th}$. The weight setting algorithm basically applies multiple voltage pulses in the process of setting a weight. The algorithm which calculates the pulse heights is adaptive—using the error observed after each pulse to make a better estimate for the next pulse. The weight setting algorithm also carries what it has learned in the process of setting one weight to the setting of the next weight. This adaptation is important for reducing the number of pulses and hence the total weight setting time.

Describing the weight setting process in more detail, the algorithm starts by identifying the address of an initial synapse cell. The desired or target weight to which the cell is to be set is then determined and an initial voltage pulse for driving the cell to the target voltage is generated. Once the initial voltage pulse is applied to the cell, the actual weight of the synapse cell is measured and compared to the target voltage.

Next, a correction to the voltage pulse amplitude and/or duration is made in order to reduce the difference between the measured weight and target weight. The new voltage pulse is then generated and applied to the synapse cell. After the newly generated voltage pulse is applied, the addressed synapse cell is once again remeasured. If the difference between remeasured weight and the target weight is outside acceptable limits, a new voltage pulse correction factor is iteratively calculated and fed back for application to the synapse cell. This process continues until the voltage difference between measured and target weights falls within acceptable limits.

Of course, other methods of setting weight values may be used without detracting from the spirit of scope of the present invention.

With reference now to FIG. 4, a flow chart of the currently preferred method of the present invention is shown. The first step represented by block 37 involves setting the synapse weights in the neural network using the adaptive weight setting described above. In other words, the desired weight setting is achieved by applying a high voltage pulse to the control gate EEPROM devices for a predetermined length of time. The algorithm determines the magnitude of the voltage pulse that is required to achieve a desired weight cell. During the weight setting process the threshold voltages of the cells are repeatedly measured and compared to the target value. In this context, $\Delta V_{th}$ is defined as the difference between the desired or target $V_{th}$ and the actual or measured $V_{th}$ such that whenever $\Delta V_{th}=0$, the actual $V_{th}$ is equal to the desired $V_{th}$.

Once all the synapse weights have been initially set to their target values, the entire neural network is placed in a high temperature oven. This is shown by block 38 in FIG. 4. The neural network is baked at a preset temperature for a predetermined amount of time to accelerate the age of the neural network under normal operating conditions. That is, a high temperature bake accelerates the charge redistribution phenomena observed to affect $V_{th}$ in floating gate devices.

The bake temperature may be set to any value greater than the normal operating temperature of the neural network. However, it is advantageous to set the bake temperature as high as is practically possible because the rate of dielectric relaxation is exponentially dependent on temperature. Of course, the maximum bake temperature is limited by the melting points and other properties of the materials used in fabricating the EPROM or EEPROM devices.

At higher temperatures, the time needed to accelerate the aging of the floating gate devices within the neural network is much shorter than at lower temperatures. The required time and temperature values can be determined by utilizing the well-known Arrhenius relationship. In the currently preferred embodiment of the present invention, the cells are baked at a temperature of approximately 250° C. for about 24 hours.

During the baking step, as explained above, a temperature accelerated charge redistribution occurs. This causes a threshold voltage shift in the floating gate transistors. As a result, the value of the threshold voltage deviates from the initial value that it was initially programmed to, thereby resulting in a non-zero $\Delta V_{th}$.

The third step in the process of FIG. 3 involves removing the neural network circuits from the bake furnace and then measuring the amount of threshold voltage shift, $\Delta V_{th}$, which has occurred. This step is shown in FIG. 3 by block 39. The voltage threshold measurements are performed using conventional test equipment and well-known measurement techniques. The deviations and threshold voltage ($\Delta V_{th}$) are recorded for future use.

The next step in the process of the present invention occurs at block 40 wherein the synapse weight values are corrected to compensate for the measured voltage threshold shifts. This step involves retraining the neural network to correct for the dielectric relaxations which have occurred as a result of baking step 38 and reprogramming the floating gate memory devices to effectively cancel out the shift and restore the predetermined change to the floating gate memory devices. The amount of dielectric relaxation is found to be proportional to the magnitude of the most recent change in stored weight.

During the initial training, the change in weight can be very large due to the charge redistribution phenomena. Following retraining, however, this change is compensated for. Effectively, the neural network has been "burned-in", with the network being adjusted to compensate for the shift in threshold voltage which has occurred due to the relaxation of dielectric 27. The end result is a higher precision stored weight in the synapse cells of the network after retraining. This higher precision is maintained over the life of the part.

The precision of the neural network can be further increased by repeating the bake/retraining cycle, as depicted by steps 38-40. That is, if the desired level of precision or accuracy has not been achieved during the first retraining cycle, the part may be rebaked, remeasured and retrained again to further correct for any additional dielectric relaxation which has occurred. This is shown in FIG. 4 by decision block 41, which includes a feedback path to block 38. Of course, the amount of relaxation which occurs in each subsequent bake cycle will be much smaller than that which occurred during the previous bake. This is in accordance with the exponential nature of the charge distribution phenomenon. This means that the amount of retraining necessary for each subsequent retraining cycle will be progressively smaller than prior retraining sessions. In this manner, the accuracy and precision of the neural network can effectively be made dielectric relaxation independent by increasing the number of bakes/retraining cycles.

FIG. 5 illustrates measured synapse weight changes versus bake time at 250° C. for a floating gate type of neural network. Line 46 indicates that an approximate 2% shift in threshold voltage normally occurs after 24 hours of baking at 250° C. As mentioned above, this shift in threshold voltage is caused by the dielectric relaxation phenomenon. Without retraining, the network exemplified by line 46 would have less than 6 bits of precision.

However, after retraining the precision of the network is increased to nearly 8 bits as illustrated by line 45 in accordance with the method of the present invention. Line 45 illustrates the improvement which results from a single retraining cycle after 24 hours of baking at 250° C. As can be seen, the precision of the retrained network drops to the same level as that characterized by line 46 only after 1000 hours of additional bake. In other words, in terms of precision or accuracy, a neural network baked and retrained in accordance with the present invention will have a significantly higher precision level throughout its lifetime compared with a network which has not been retrained.

It should be apparent that the concept of the present invention is broad enough to encompass areas of technology beyond the field of analog neural nets. That is, the method of the present invention is useful for increasing the accuracy of any circuit which relies upon an analog charge level stored in a floating gate device as long as that device exhibits the charge redistribution phenomena described above. This is because dielectric relaxation gradually affects the voltage threshold of the floating gate devices, with the inevitable result being a loss of accuracy. However, the present invention provides a solution to this problem by effectively correcting the voltage threshold shift which would normally occur over the lifetime of the part. Therefore, the present invention is not considered limited solely to neural network applications.

Although the present invention has been described into conjunction with one specific embodiment, it is appreciated that the present invention may used in other embodiments and for other applications. Consequently, it is to be understood that the particular embodiments shown and described by way of illustration are in no way intended to be considered limiting. The reference to the details of the preferred embodiment are not intended to limit the scope of the claims which themselves recite only those features regarded as essential to the invention.

We claim:

1. A method of increasing the accuracy of an analog circuit employing floating gate memory devices which are programmed by transferring charge onto a floating gate member insulated from a substrate by a tunnel oxide and from a control gate by a dielectric layer comprising an oxide-nitride-oxide stack, a dipole being formed in said dielectric layer upon programming of said floating gate memory devices, said method comprising the steps of:
(a) programming said floating gate memory devices with a predetermined charge;
(b) baking said circuit to accelerate the redistribution of charge within said dielectric, said redistribution causing a shift in the voltage threshold of said floating gate memory devices; and
(c) reprogramming said floating gate memory devices to effectively cancel out said shift and restore said predetermined charge to said floating gate memory devices.

2. The method of claim 1 further comprising the step of:
(d) repeating steps (b) and (c) to further increase the accuracy of said circuit.

3. The method of claim 1 wherein said floating gate devices are both electrically programmable and electrical erasable memory devices.

* * * * *